US006559986B1

United States Patent
Sauer et al.

(10) Patent No.: US 6,559,986 B1
(45) Date of Patent: May 6, 2003

(54) METHOD FOR CONVERTING THE SIGNAL MODULATION OF CHANNELS OF AN OPTICAL MULTIPLEX SYSTEM TO SUBCARRIER FREQUENCIES

(75) Inventors: Michael Sauer, Dresden (DE); Walter Nowak, Dresden (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/395,314

(22) Filed: Sep. 13, 1999

Related U.S. Application Data

(63) Continuation of application No. PCT/DE98/00709, filed on Mar. 11, 1998.

(30) Foreign Application Priority Data

Mar. 12, 1997 (DE) .......................................... 197 10 033

(51) Int. Cl.[7] .......................... H04B 10/00; H04B 10/12
(52) U.S. Cl. ...................................... 359/124; 359/130
(58) Field of Search .............................. 359/161, 173, 359/181, 183, 761, 110, 124–140

(56) References Cited

U.S. PATENT DOCUMENTS

| | | | | |
|---|---|---|---|---|
| 5,267,072 A | * | 11/1993 | Maleki | 359/158 |
| 5,526,170 A | * | 6/1996 | Esman et al. | 356/318 |
| 5,566,381 A | * | 10/1996 | Korotky | 359/183 |
| 5,596,436 A | * | 1/1997 | Sargis | 359/132 |
| 5,625,479 A | * | 4/1997 | Suzuki | 359/135 |
| 5,687,261 A | * | 11/1997 | Logan | 85/24 |
| 5,710,649 A | * | 1/1998 | Mollenauer | 359/123 |
| 5,710,651 A | * | 1/1998 | Logan | 359/145 |
| 5,724,459 A | * | 3/1998 | Banba | 385/3 |
| 5,940,196 A | * | 8/1999 | Piehler | 359/133 |
| 5,953,139 A | * | 9/1999 | Nemecek et al. | 359/124 |

OTHER PUBLICATIONS

Yang–Han Lee et al.: "Application of fiber Brillouin Amplifiers on Coherent Optical Wavelength Division– and Sub-carrier–Multiplexing (WDM–SCM) System", Journal of Optical Communications, Sep. 13, 1992, No. 3, pp. 99–103.
Rolf–Peter Braun et al.: "Optische Mikrowllentechnik für zukünftige zellulare Mobilfunknetze", Nachrichtentechnik Elektronik, No., Sep./Oct. 5, 1995, pp. 63–67.
J. Park et al.: "Millimeter–wave electro optical upconverter for wireless digital communications" in electronics Letters, Jun. 22, 1995, vol. 31, No. 13, pp. 1085–1086.
Michael Sauer et al.: "Effektive Nutzung von WDM in Millimeter–Wellen Faser–Funk–Systemen", effective use of WDM in millimeter–wave fiber–radio–systems, Technical University Dresden, Department for Signal Technology, Dresden, Germany.

* cited by examiner

Primary Examiner—Leslie Pascal
Assistant Examiner—Agustin Bello
(74) Attorney, Agent, or Firm—Laurence A. Greenberg; Werner H. Stemer; Ralph E. Locher

(57) ABSTRACT

Useful signals in the baseband or else in an intermediate frequency band are impressed on a plurality of laser diodes or other suitable optical sources having different emission wavelengths, and the wavelength channels thus formed are brought together. An external modulator with a high cutoff frequency is inserted into this wavelength multiplex system and is driven at the desired microwave or millimetric wave subcarrier frequency or a subharmonic thereof, with the result that the modulation of all the wavelength channels is converted upward. The individual wavelength channels are decoupled in a wavelength-selective fashion to arbitrary photodiodes or other direct receivers that supply the selected useful signal modulated onto the subcarrier.

10 Claims, 1 Drawing Sheet

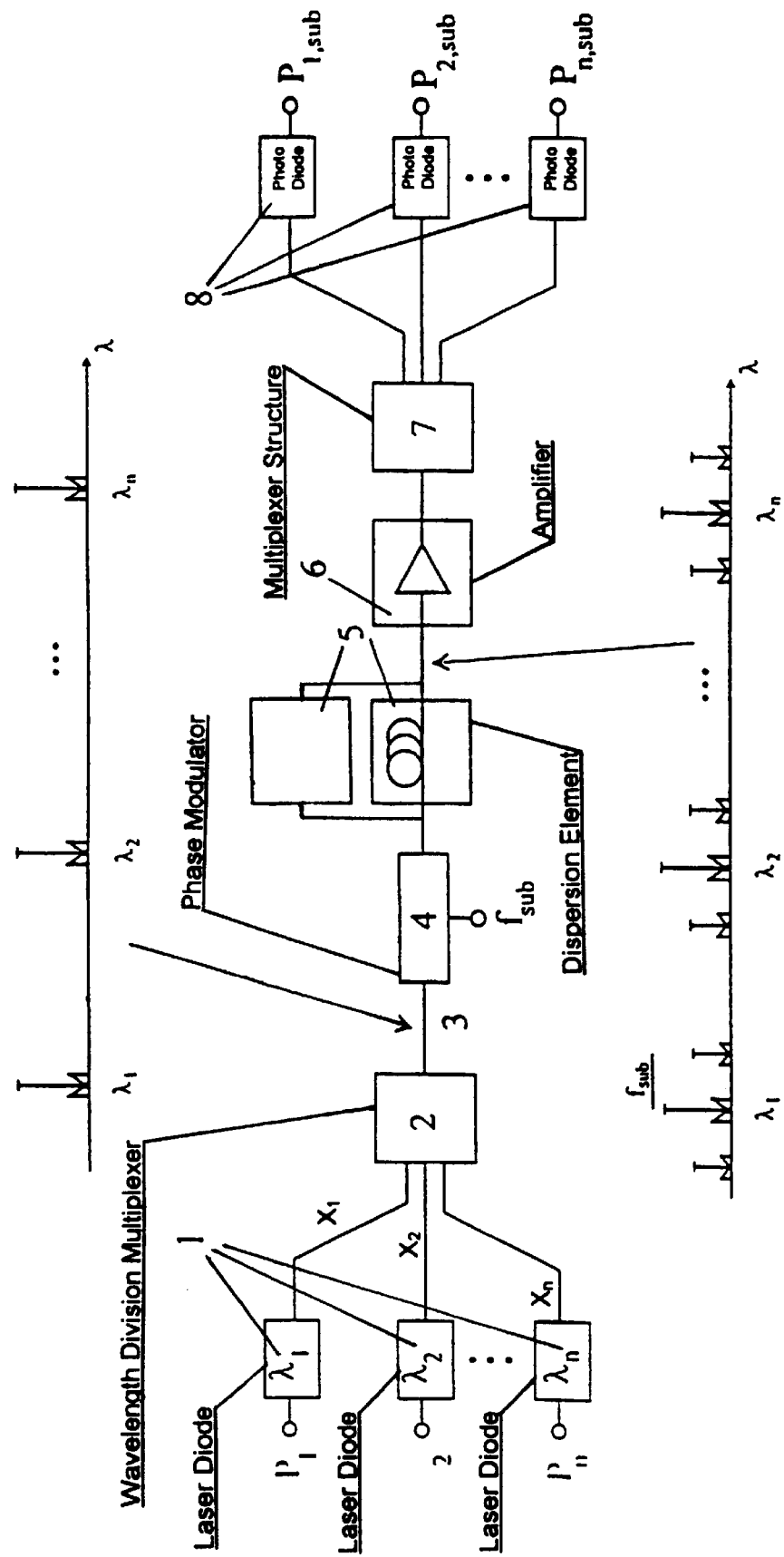

METHOD FOR CONVERTING THE SIGNAL MODULATION OF CHANNELS OF AN OPTICAL MULTIPLEX SYSTEM TO SUBCARRIER FREQUENCIES

CROSS-REFERENCE TO RELATED APPLICATIONS

This is a continuation of copending International Application PCT/DE98/00709, filed Mar. 11, 1998, which designated the United States.

BACKGROUND OF THE INVENTION

Field of the Invention

The invention relates to a method for converting the signal modulation of channels of an optical multiplex system to subcarrier frequencies.

Optical microwave and millimetric wave transmission (the latter is incorporated below in general into the term microwave transmission) is of great interest, inter alia, for supplying base stations in mobile telephone systems with high carrier frequencies. The aim in this case is to obtain the complete microwave signal, which contains the microwave subcarrier and a signal modulation, which is generally of a substantially lower frequency, directly from the photodiode. Various methods are known for optical microwave generation, which are represented, for example, in the overview by R.-P. Braun and co-authors in Nachrichtentechnik/Elektronik, Berlin, 45 (1995) pages 63–67, entitled "Optische Mikrowellentechnik für zukünftige zellulare Mobilfunknetze" ["Optical Microwave Engineering For Future Cellular Mobile Radio Networks"].

In the heterodyne methods, the generation of the microwaves as differential frequency of two light-waves of which one is modulated and the other is a local or remote oscillator is performed in the photodiode. A disadvantage is the phase noise produced. This is avoided in the self-heterodyne method. Alternatives are, for example, the resonance modulation of mode-coupled semiconductor lasers, or the sideband-injection locking of two laser diodes.

Another solution is specified in the reference entitled "Millimeter-Wave Electro-Optical Upconverter For Wireless Digital Communications" by J. Park, M. S. Shakouri, and K. Y. Lau, Electronics Letters, 31 (1995), pages 1085 to 1086. Signal modulation is firstly carried out in the laser diode, followed by upward conversion by modulation with the subcarrier frequency.

Time-division multiplex, wavelength division multiplex, code division multiplex and polarization division multiplex are generally known for the transition from simplex transmission to an optical multiplex transmission system, with subcarrier division multiplex, in addition, being known for microwave transmission.

SUMMARY OF THE INVENTION

It is accordingly an object of the invention to provide a method for converting the signal modulation of channels of an optical multiplex system to subcarrier frequencies which overcomes the above-mentioned disadvantages of the prior art methods of this general type, in which different signals in the baseband or intermediate frequency band, which have been impressed on optical carriers of different wavelengths, are converted with the aid of a component onto a microwave or millimetric wave subcarrier. It is assumed that the useful signal frequencies are sufficiently lower than the subcarrier frequency.

With the foregoing and other objects in view there is provided, in accordance with the invention, a method for converting signal modulation of optical channels to one of microwave and millimetric wave subcarriers, which includes:

impressing in each case a signal modulation having a frequency lower than a subcarrier frequency on optical sources having different emission wavelengths;

bring together a plurality of optical wavelength channels thus formed into a fiber bus;

modulating the plurality of optical wavelength channels with a modulator controlled by one of the subcarrier frequency and a subharmonic thereof; and separating the plurality of optical wavelength channels in a wavelength-selective fashion and leading them to direct receivers.

It is essential to the invention that all the wavelength channels brought together are converted, when modulated, to higher frequencies by a single external modulator having a high cutoff frequency. In this case, no distortions of the signal modulation already performed occur, but only harmonics of this modulation. They permit the external modulator to be operated in the case of subharmonics of the subcarrier frequency. If desired, all the wavelength channels can be amplified by a single fiber amplifier. Intensity-modulated signals are required for the purpose of direct reception, for example by photodiodes, for which reason consideration is firstly given to an intensity modulator for converting signals onto the microwave subcarrier.

By contrast, when use is made of a phase modulator and dispersion elements in accordance with the reference written by W. Nowak and M. Sauer entitled "Dynamikbereichserhöhung in optischen Mikrowellen-Subcarriersystemen durch Dispersionsmanagement" ["Dynamic Range Expansion In Optical Microwave Subcarrier Systems By Dispersion Management"], MIOP '97, Sindelfingen, April 1997, it is possible to achieve at the photodiode a power gain of 3 dB optical corresponding to 6 dB electrical. Since a phase modulator needs only half the drive power by contrast with a comparable intensity modulator, the result is a power gain of 9 dB when the ratio of photodiode power to drive power of the modulator is considered.

In using the method of the invention with a standard fiber as the dispersion element in the 1.55 $\mu$m band in the case of a subcarrier frequency of 60 GHz, this requires a fiber length of approximately 1 km (or approximately 3 km, 5 km, . . . ) (the subcarrier power going sinusoidally with the fiber length). If the fiber lengths of all the wavelength channels differ from one another by no more than +/−200 m, it is then possible to make use in the bus of a single additional fiber length which supplements the existing mean fiber length to 1 km, additional losses for the maximum and minimum fiber lengths can then be <0.5 dB electric. Additional lengths are to be provided in the individual connections in the case of large differences in length.

The occurrence of harmonics of the subcarrier modulation frequency owing to the nonlinear modulator characteristic can lead to crosstalk from one optical channel to other ones, when the optical channel spacings correspond to integral multiples of the subcarrier frequency. This can be countered by selecting the optical channel spacings suitably such that higher harmonics of other channels do not fall into the subcarrier band.

Other features which are considered as characteristic for the invention are set forth in the appended claims.

Although the invention is illustrated and described herein as embodied in a method for converting the signal modulation of channels of an optical multiplex system to subcarrier frequencies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, block diagram of an optical system for performing the method according to the invention.

DESCRIPTION OF THE PREFERRED EMBODIMENTS

Referring now to the FIGURE of the drawing in detail, there are shown respective modulation signals $P_k$ that are impressed on laser diodes 1 having different emission wavelengths $\lambda_k$. Optical channels $X_k$ are brought together in a fiber bus 3 with the aid of a wavelength division multiplexer 2. In order to convert to the subcarrier frequency, use is made of a phase modulator being an external modulator 4 that is controlled by the subcarrier frequency $f_{sub}$. An additional length of a standard fiber serves as a dispersion element 5. The combination of the phase modulator 4 and the dispersion element 5 can also be replaced by an intensity modulator. A fiber amplifier 6 can serve to raise the power level and thus the dynamics of the system.

After the transmission, the optical channel selection is performed with the aid of a suitable multiplex structure 7 and a connection to a photodiode (receiver) 8 exclusive for each channel. The modulation signal $P_k$, converted to the subcarrier frequency, of the individual laser diodes 1 is to be extracted at these photodiodes 8, whose cutoff frequency should be equal to or greater than the subcarrier frequency.

We claim:

1. A method for converting signals, which comprises:
    converting signal modulations of optical channels to one of microwave and millimetric wave subcarriers by:
        impressing in each case a signal modulation having a frequency lower than a subcarrier frequency on optical sources having different emission wavelengths;
        bringing together a plurality of optical wavelength channels thus formed into a fiber bus;
        modulating the plurality of optical wavelength channels with a single modulator controlled by one of the subcarrier frequency and a subharmonic thereof; and
        separating the plurality of optical wavelength channels in a wavelength-selective fashion and leading them to direct receivers.

2. The method according to claim 1, wherein the modulator is an external intensity modulator.

3. The method according to claim 1, which further comprises:
    providing neighboring optical wavelength channels having a frequency; and
    spacing the frequency of the neighboring optical wavelength channels equally with the subcarrier frequency.

4. The method according to claim 1, which further comprises:
    providing neighboring optical wavelength channels having a frequency; and
    spacing the frequency of the neighboring optical wavelength channels differently than the subcarrier frequency.

5. The method according to claim 1, which further comprises:
    modulating a signal of the optical sources in a baseband.

6. The method according to claim 1, which further comprises:
    modulating a signal of the optical sources in an intermediate frequency band in conjunction with different intermediate frequencies such that, after said modulating, different subcarrier frequencies are produced for different optical wavelength channels.

7. The method according to claim 1, wherein the optical sources are laser diodes.

8. The method according to claim 1, which further comprises:
    modulating a signal of the optical sources in an intermediate frequency band.

9. A method for converting signals, which comprises:
    converting signal modulations of optical channels to one of microwave and millimetric wave subcarriers by:
        impressing in each case a signal modulation having a frequency lower than a subcarrier frequency on optical sources having different emission wavelengths;
        bringing together a plurality of optical wavelength channels thus formed into a fiber bus;
        modulating the plurality of optical wavelength channels with a single modulator controlled by one of the subcarrier frequency and a subharmonic thereof;
        separating the plurality of optical wavelength channels in a wavelength-selective fashion and leading them to direct receivers;
        providing the modulator as an external phase modulator;
        providing a broadband dispersion element disposed in the fiber bus;
        providing individual dispersion elements disposed outside the fiber bus; and
        using fibers of a specific length as the broadband dispersion element and the individual dispersion elements.

10. A method for converting signals, which comprises:
    converting signal modulations of optical channels to one of microwave and millimetric wave subcarriers by:
        impressing in each case a signal modulation having a frequency lower than a subcarrier frequency on optical sources having different emission wavelengths;
        bringing together a plurality of optical wavelength channels thus formed into a fiber bus;
        modulating the plurality of optical wavelength channels with a single modulator controlled by one of the subcarrier frequency and a subharmonic thereof; and
        separating the plurality of optical wavelength channels in a wavelength-selective fashion and leading them to direct receivers, the modulator being an external phase modulator with individual dispersion elements disposed outside the fiber bus, and the dispersion elements being fibers of a specific length.

* * * * *